United States Patent
Vrtis et al.

(10) Patent No.: US 9,723,713 B1
(45) Date of Patent: Aug. 1, 2017

(54) FLEXIBLE PRINTED CIRCUIT BOARD HINGE

(71) Applicant: Multek Technologies, Ltd, San Jose, CA (US)

(72) Inventors: Joan K. Vrtis, Mesa, AZ (US); Michael James Glickman, Mountain View, CA (US); Mark Bergman, Redwood City, CA (US); Shurui Shang, San Jose, CA (US)

(73) Assignee: Multek Technologies, Ltd., San Jose, CA (US)

( * ) Notice: Subject to any disclaimer, the term of this patent is extended or adjusted under 35 U.S.C. 154(b) by 0 days.

(21) Appl. No.: 14/712,842

(22) Filed: May 14, 2015

Related U.S. Application Data

(60) Provisional application No. 61/994,748, filed on May 16, 2014.

(51) Int. Cl.
  *H05K 1/00* (2006.01)
  *H05K 1/02* (2006.01)
(52) U.S. Cl.
  CPC .................................. *H05K 1/0281* (2013.01)
(58) Field of Classification Search
  CPC .. H05K 1/0278; H05K 3/4691; H05K 3/4652; H05K 1/028; H05K 1/147; H05K 1/148; H05K 1/0281
  USPC .................................. 174/254, 255; 361/749
  See application file for complete search history.

(56) References Cited

U.S. PATENT DOCUMENTS

| | | | |
|---|---|---|---|
| 2,911,605 A | 11/1959 | Wales, Jr. | |
| 3,471,348 A * | 10/1969 | Iles | H05K 3/4691 174/255 |
| 4,051,425 A | 9/1977 | Smith | |
| 4,495,546 A | 1/1985 | Nakamura et al. | |
| 4,712,160 A | 12/1987 | Sato et al. | |
| 4,788,626 A | 11/1988 | Neidig et al. | |
| 4,893,227 A | 1/1990 | Gallios et al. | |
| 4,899,256 A | 2/1990 | Sway-Tin | |
| 4,901,069 A | 2/1990 | Veneruso | |
| 4,975,821 A | 12/1990 | Lethellier | |
| 5,101,322 A | 3/1992 | Ghaem et al. | |
| 5,121,297 A * | 6/1992 | Haas | H05K 3/4691 174/254 |
| 5,164,657 A | 11/1992 | Gulczynski | |
| 5,184,827 A | 2/1993 | Suttle | |
| 5,235,491 A | 8/1993 | Weiss | |
| 5,259,833 A | 11/1993 | Barnett | |
| 5,262,932 A | 11/1993 | Stanley et al. | |

(Continued)

*Primary Examiner* — Steven T Sawyer
(74) *Attorney, Agent, or Firm* — Haverstock & Owens LLP

(57) ABSTRACT

In order to limit the stress and strain applied to a printed circuit board while still maintaining flexibility, a flexible section of the printed circuit board is configured to have a non-linear portion that functions as a hinge when the flexible section is bent, flexed, twisted or otherwise subjected to a motion related force. The hinge configuration improves durability and flexibility while minimizing ripping and cracking of the printed circuit board, particularly interconnects within the flexible section and a transition region between the flexible section and a rigid section of the printed circuit board. The hinge is configured to have a non-linear shape, such as a serpentine or circuitous path that can include curved portions, different linear portions or some combination of curved and linear portions.

22 Claims, 3 Drawing Sheets

(56) References Cited

U.S. PATENT DOCUMENTS

| | | |
|---|---|---|
| 5,295,044 A | 3/1994 | Araki et al. |
| 5,445,869 A * | 8/1995 | Ishikawa ............... H05K 1/028 |
| | | 428/209 |
| 5,490,052 A | 2/1996 | Yoshida et al. |
| 5,565,761 A | 10/1996 | Hwang |
| 5,565,781 A | 10/1996 | Dauge |
| 5,592,128 A | 1/1997 | Hwang |
| 5,712,772 A | 1/1998 | Telefus et al. |
| 5,742,151 A | 4/1998 | Hwang |
| 5,747,977 A | 5/1998 | Hwang |
| 5,798,635 A | 8/1998 | Hwang et al. |
| 5,804,950 A | 9/1998 | Hwang et al. |
| 5,811,895 A | 9/1998 | Suzuki et al. |
| 5,818,207 A | 10/1998 | Hwang |
| 5,870,294 A | 2/1999 | Cyr |
| 5,894,243 A | 4/1999 | Hwang |
| 5,903,138 A | 5/1999 | Hwang et al. |
| 5,905,369 A | 5/1999 | Ishii et al. |
| 5,923,543 A | 7/1999 | Choi |
| 6,039,600 A | 3/2000 | Etters et al. |
| 6,058,026 A | 5/2000 | Rozman |
| 6,069,803 A | 5/2000 | Cross |
| 6,077,124 A | 6/2000 | Etters et al. |
| 6,160,254 A | 12/2000 | Zimmerman |
| 6,160,725 A | 12/2000 | Jansen et al. |
| 6,272,015 B1 | 8/2001 | Mangtani |
| 6,282,092 B1 | 8/2001 | Okamoto et al. |
| 6,307,751 B1 * | 10/2001 | Bodony ................... G06F 1/16 |
| | | 361/679.08 |
| 6,344,980 B1 | 2/2002 | Hwang et al. |
| 6,358,064 B2 | 3/2002 | Szalay et al. |
| 6,396,277 B1 | 5/2002 | Fong et al. |
| 6,407,514 B1 | 6/2002 | Glaser et al. |
| 6,469,914 B1 | 10/2002 | Hwang et al. |
| 6,469,980 B1 | 10/2002 | Takemura et al. |
| 6,483,281 B2 | 11/2002 | Hwang |
| 6,531,854 B2 | 3/2003 | Hwang |
| 6,541,944 B2 | 4/2003 | Hwang |
| 6,578,253 B1 | 6/2003 | Herbert |
| 6,605,930 B2 | 8/2003 | Hwang |
| 6,671,189 B2 | 12/2003 | Jansen et al. |
| 6,674,272 B2 | 1/2004 | Hwang |
| 6,711,024 B1 * | 3/2004 | Johansson .............. H05K 1/189 |
| | | 361/760 |
| 6,958,920 B2 | 10/2005 | Mednik et al. |
| 7,047,059 B2 | 5/2006 | Avrin et al. |
| 7,286,376 B2 | 10/2007 | Yang |
| 7,439,962 B2 | 10/2008 | Reynolds et al. |
| 7,629,691 B2 | 12/2009 | Roush |
| 7,641,488 B2 | 1/2010 | Ho |
| 8,469,741 B2 | 6/2013 | Oster |
| 2002/0011823 A1 | 1/2002 | Lee |
| 2002/0092675 A1 * | 7/2002 | Kusaka .................. H05K 1/028 |
| | | 174/261 |
| 2003/0035303 A1 | 2/2003 | Balakrishnan et al. |
| 2004/0228153 A1 | 11/2004 | Cao et al. |
| 2004/0243204 A1 | 12/2004 | Maghribi |
| 2005/0105224 A1 | 5/2005 | Nishi |
| 2005/0237725 A1 * | 10/2005 | Cho ....................... H01R 35/02 |
| | | 361/752 |
| 2006/0128346 A1 * | 6/2006 | Yasui ..................... H05K 1/189 |
| | | 455/333 |
| 2007/0125295 A1 | 6/2007 | Sanguinetti |
| 2008/0060873 A1 | 3/2008 | Lang |
| 2008/0179082 A1 * | 7/2008 | Kinoshita ......... H01M 10/4257 |
| | | 174/255 |
| 2009/0242241 A1 | 10/2009 | Takahashi |
| 2009/0273460 A1 | 11/2009 | Mancosu |
| 2010/0090834 A1 | 4/2010 | Buchnick |
| 2011/0050381 A1 | 3/2011 | Olson |
| 2012/0050036 A1 | 3/2012 | Landry |
| 2012/0051005 A1 * | 3/2012 | Vanfleteren ........... H01L 21/565 |
| | | 361/749 |
| 2013/0160183 A1 | 6/2013 | Reho |
| 2013/0161055 A1 | 6/2013 | Rule |
| 2013/0256004 A1 | 10/2013 | Cotton |
| 2014/0124257 A1 * | 5/2014 | Yoshihara ............. H05K 1/023 |
| | | 174/350 |
| 2014/0362020 A1 | 12/2014 | Rothkopf |
| 2015/0009129 A1 | 1/2015 | Song |
| 2015/0091711 A1 | 4/2015 | Kosonen |
| 2015/0185944 A1 | 7/2015 | Magi |
| 2015/0312653 A1 | 10/2015 | Avrahami |
| 2016/0187122 A1 | 6/2016 | Krimon |

* cited by examiner

FLEXIBLE PRINTED CIRCUIT BOARD HINGE

RELATED APPLICATIONS

This Patent Application claims priority under 35 U.S.C. 119(e) of the U.S. provisional patent application, Application No. 61/994,748, filed on May 16, 2014, and entitled "HINGE", which is hereby incorporated in its entirety by reference.

FIELD OF THE INVENTION

The present invention is generally directed to printed circuit boards. More specifically, the present invention is directed to flexible printed circuit board configured as a hinge.

BACKGROUND OF THE INVENTION

Electronic devices are increasingly being developed so as to be worn by a user, such as in wearable electronics. As these wearable electronics gain traction in the marketplace, a new breed of devices that are able to bend, flex and stretch must be developed. These mechanical requirements present reliability challenges on mechanical components, circuit boards and other interconnects, as well as electronic components. For dynamic applications, especially where the desired amount of stretch and strain is unknown, it is important to strengthen the printed circuit board so that it is able to bend and twist without failing. Particularly, twisting and bending of a flexible circuit board can create points of failure of between rigid and flexible sections. It is desired to develop wearable electronics that limit the stress and strain to the constituent components while still maintaining flexibility and functionality.

SUMMARY OF THE INVENTION

In order to limit the stress and strain applied to a printed circuit board while still maintaining flexibility, a flexible section of the printed circuit board is configured to have a non-linear portion that functions as a hinge when the flexible section is bent, flexed, twisted or otherwise subjected to a motion related force. The hinge configuration improves durability and flexibility while minimizing ripping and cracking of the printed circuit board, particularly interconnects within the flexible section and a transition region between the flexible section and a rigid section of the printed circuit board. The hinge is configured to have a non-linear shape, such as a serpentine or circuitous path that can include curved portions, different linear portions or some combination of curved and linear portions. Examples of such non-linear shapes include, but are not limited to, an "S" shape or a sawtooth shape.

In an aspect, a circuit board is disclosed that includes one or more rigid sections, one or more flexible sections coupled to the one or more rigid sections, and one or more radius sections formed within portions of the one or more flexible sections that extend from the one or more rigid sections. In some embodiments, the one or more flexible sections are a flexible circuit board. In some embodiments, the one or more flexible sections are a stretchable circuit board. In some embodiments, each of the one or more radius sections has a radius greater than zero. In some embodiments, the one or more radius sections have a length of greater than zero to ten inches. In some embodiments, a stress applied to the bending, flexing or twisting of the one or more flexible sections is distributed across the one or more radius sections. In some embodiments, the one or more radius sections form a directional change in the portion of the one or more flexible sections in an X-Y direction that corresponds to a length and width of the one or more flexible sections. In some embodiments, the one or more radius sections form a directional change in the portion of the one or more flexible sections in an X-Z direction that corresponds to a length and thickness of the one or more flexible sections. In some embodiments, the one or more radius sections reduce crimping or creasing at a rigid to flexible transition area.

In another aspect, a circuit board is disclosed that includes a rigid section, and a flexible section coupled to the rigid section, wherein the flexible section includes a hinge having a non-linear shape with a plurality of directional change points. In some embodiments, when the flexible section is moved relative to the rigid section a stress is applied, and the stress is distributed across the hinge. In some embodiments, the stress is distributed to each of the plurality of directional change points of the hinge. In some embodiments, the flexible section is a flexible circuit board. In some embodiments, the flexible section is a stretchable circuit board. In some embodiments, each of the plurality of directional change points is a corner. In some embodiments, each of the plurality of directional change points is a curve. In some embodiments, each of the plurality of directional change points is either a corner or a curve. In some embodiments, the non-linear shape is a sawtooth pattern. In some embodiments, the non-linear shape is a S-shaped pattern. In some embodiments, the non-linear shape is a serpentine pattern. In some embodiments, the hinge has a length of greater than zero to ten inches. In some embodiments, each of the plurality of directional point changes form a directional change in the flexible section in an X-Y direction that corresponds to a length and a width of the flexible section. In some embodiments, each of the plurality of directional point changes form a directional change in the flexible section in an X-Z direction that corresponds to a length and a thickness of the flexible section. In some embodiments, one or more of the plurality of directional point changes form a directional change in the flexible section in an X-Y direction that corresponds to a length and a width of the flexible section, and one or more of the plurality of directional point changes form a directional change in the flexible section in an X-Z direction that corresponds to the length and a thickness of the flexible section. In some embodiments, the hinge reduces crimping or creasing at a rigid to flexible transition area.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board hinge. Those of ordinary skill in the art will realize that the following detailed description of the printed circuit board hinge is illustrative only and is not intended to be in any way limiting. Other embodiments of the printed circuit board hinge will readily suggest themselves to such skilled persons having the benefit of this disclosure.

Reference will now be made in detail to implementations of the printed circuit board hinge as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

A printed circuit board can be configured having a multi-layer body, one or more layers of which include rigid sections and one or more layers of which include flexible sections. As used herein, "rigid" is a relative term and refers to those sections that are more rigid than other sections such as the flexible sections. The rigid sections and flexible sections can be configured in the same vertical stack, such as to form overlapping portions. Interconnects can be formed between the one or more rigid sections and the one or more flexible sections. In some embodiments, the interconnects are electrical interconnects, such as conductive traces. In other embodiments, the interconnects are optical interconnects, such as waveguides. It is understood that other types of interconnects are contemplated.

Figure 1:
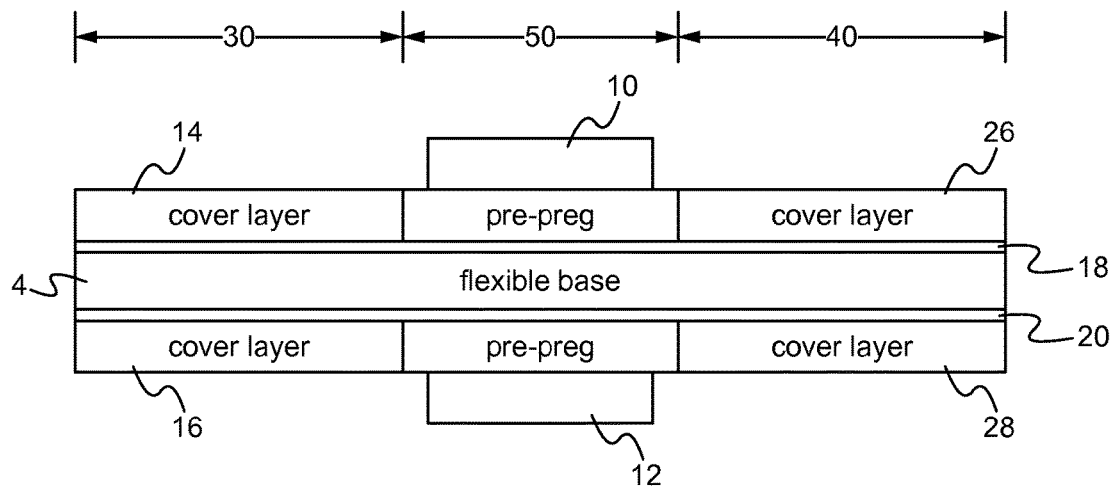
FIG. 1 illustrates a side view of a printed circuit board stack according to an embodiment.

FIG. 1 illustrates a side view of a printed circuit board stack according to an embodiment. The printed circuit board includes a flexible section 30, a flexible section 40 and a rigid section 50. The printed circuit board includes a flexible base 4 that extends through the rigid section 50 in addition to the two flexible sections 30 and 40. In some embodiments, the flexible base 4 is made of polyimide. It is understood that other flexible materials can be used. In other embodiments, the flexible base does not extend through the entire rigid section. For example, the flexible section 30 may include a first flexible base that extends partially into a first end of the rigid section, and the flexible section 40 may include a second flexible base that extends partially into a second end of the rigid section.

Interconnects can be formed on either or both surfaces of the flexible base 4. In the exemplary configuration shown in FIG. 1, an interconnect layer 18 is formed on a first surface of the flexible base 4 and an interconnect layer 20 is formed on a second surface of the flexible base 4. In some embodiments, the interconnect layers 18 and 20 are patterned copper interconnects that form electrically conductive interconnects. It is understood that other electrically conductive materials can be used. In other embodiments, the interconnect layers 18 and 20 form optical interconnects, such as waveguides.

In the rigid section, a pre-preg layer is added over each interconnect layer. As shown in FIG. 1, in the rigid section 50 a pre-preg 6 is added over the interconnect layer 18 and a pre-preg layer 8 is added over the interconnect layer 20. Additional interconnect layers and pre-preg layers can be added to the rigid section. An interconnect layer is formed on the top-most pre-preg layer, such as an interconnect layer 22 formed on the pre-preg layer 6. In the case of a printed circuit board having electronic components mounted onto both sides, for example the top side and the bottom side, of the printed circuit board, an interconnect layer is also formed on the bottom-most pre-preg layer, such as an interconnect layer 24 formed on the pre-preg layer 8. One or more electronic components are coupled to the printed circuit board in the rigid section 50. In the exemplary configuration of FIG. 1, an electronic component 10 is coupled to the interconnect layer 22 and an electronic component 12 is coupled to the interconnect layer 24.

In each flexible section, a cover layer is added over each interconnect layer. As shown in FIG. 1, in the flexible section 30 a cover layer 14 is added over the interconnect layer 18 and a cover layer 16 is added over the interconnect layer 20. In the flexible section 40 a cover layer 26 is added over the interconnect layer 18 and a cover layer 28 is added over the interconnect layer 20. The cover layer material can acrylic, polyimide, acrylic-epoxy or other polymeric material with a Glass Transition Temperature (Tg) greater than 100 degrees Celsius. The cover layer material may or may not be filled with micro-particles or nano-particles or a woven reinforced material that can be organic or inorganic. Additional interconnect layers and cover layers can be added to each flexible section. An interconnect layer can be formed on the exposed top-most and/or bottom-most cover layers.

Figure 2:
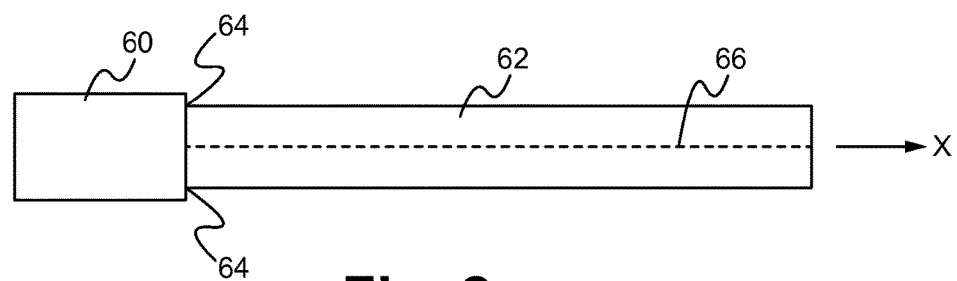
FIG. 2 illustrates a top down view of printed circuit board according to an embodiment.

FIG. 2 illustrates a top down view of printed circuit board according to an embodiment. The printed circuit board includes a rigid section 60 and a flexible section 62. The stack of the rigid section 60 can be similar to the stack of the rigid section 50 shown in FIG. 1, and the stack of the flexible section 62 can be similar to the stack of the flexible section 40. Although the printed circuit board is shown in FIG. 2 as having only a single flexible section 62, it is understood that one or more additional flexible sections can be coupled to the rigid section 60. The top down view shows that a footprint of the rigid section 60 has a rectangular shape. It is understood that alternative shapes are also contemplated. The flexible section 62 extends laterally from the rigid section 60. The flexible section 62 is said to be shaped linearly since a central axis 66 of the flexible section 62 maintains a straight line as the flexible section extends laterally from the rigid section 60. In other words, the central axis 66 is parallel to the x-axis along its entire length.

The interface between the rigid section 60 and the flexible section 62 forms a rigid to flexible transition. When the flexible section extends linearly from the rigid section, as does the flexible section 62, and the flexible section 62 is subject to bending, flexing, twisting or other related movement relative to the rigid section 60, stress is concentrated at the interface junction between the rigid section 60 and the flexible section 62, and stress is particularly concentrated at the corner points 64 at the interface. Concentrated stress points provide points of failure that may ultimately result in damage to the interconnects at these points, such as severing of electrically conductive traces.

Figure 3:
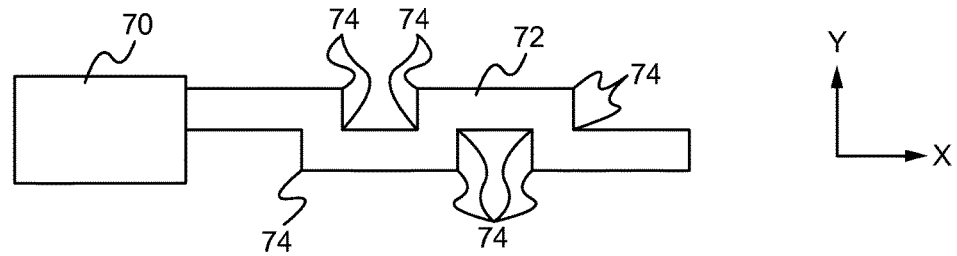
FIG. 3 illustrates a top down view of a printed circuit board with a flexible section configured as a hinge according to an embodiment.
Figure 4:
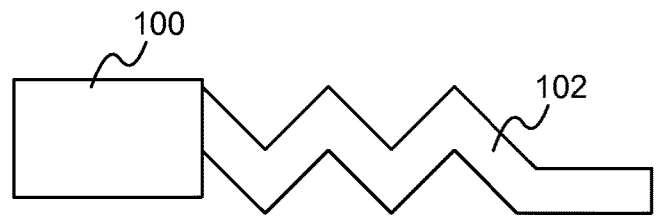
FIG. 4 illustrates a top down view of a printed circuit board with a flexible section configured as a hinge according to another embodiment.

By configuring all or some of the flexible section in a non-linear shape, the stress is dispersed from the junction interface and is distributed across the length of the non-linear portion. The non-linear portion of the flexible section is referred to as a hinge. The hinge has one or more directional change points that form the non-linear shape. Each directional change, referred to as a hinge loop, can be gradual, such as a bend, arc, or curve, or more pronounced, such as a corner. Examples of such "corners" can include, but are not limited to, a 90 degree transition as in a square or rectangle, as shown in FIG. 3, or a transition less or greater than 90 degrees, as in a triangle or trapezoid, as shown in FIG. 4. In this manner the hinge can have, for example, a saw-tooth design or offset squares design. FIG. 3 illustrates a top down view of a printed circuit board with a flexible section configured as a hinge according to an embodiment. A flexible section 72 of the printed circuit board is coupled to a rigid section 70. The rigid section 70 and the flexible section 72 can have stack configurations similar to those previously described, such as the stacks shown in FIG. 1. Alternative stack configurations are also contemplated. A portion of the flexible section 72 is configured as a hinge. In the exemplary configuration shown in FIG. 3, the hinge has multiple direction changes, such as at directional change points 74. The exemplary directional change points 74 form 90 degree corners. In some embodiments, the hinge portion of the flexible section is that portion of the flexible section immediately adjacent to the interface with the rigid section, as shown in FIG. 3. In other embodiments, the hinge portion of the flexible section is displaced from the interface. A length of the hinge can be the entire portion of the flexible section or some smaller portion. In an exemplary application, the hinge length is between 0 and 10 inches.

FIG. 4 illustrates a top down view of a printed circuit board with a flexible section configured as a hinge according to another embodiment. A flexible section 102 of the printed circuit board is coupled to a rigid section 100. In the exemplary configuration shown in FIG. 4, the hinge has multiple direction changes, each of which forms a corner with an angle greater than 90 degree. Such a configuration forms a saw-tooth type hinge.

Figure 5:
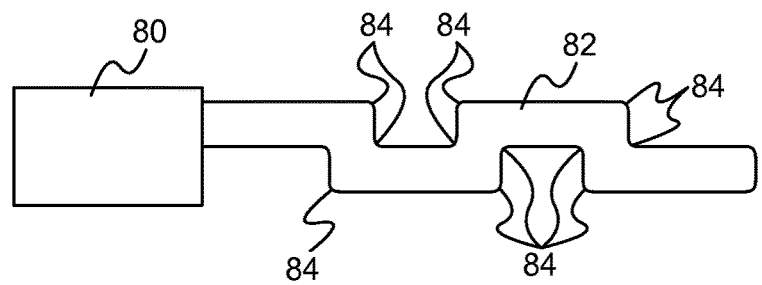
FIG. 5 illustrates a top down view of a printed circuit board with a flexible section configured as a hinge according to yet another embodiment.

The directional change points can also be curves or bends. FIG. 5 illustrates a top down view of a printed circuit board with a flexible section configured as a hinge according to yet another embodiment. A flexible section 82 of the printed circuit board is coupled to a rigid section 80. In the exemplary configuration shown in FIG. 4, the hinge has multiple direction changes, such as directional change points 84. The exemplary directional change points 84 form 90 degree curves.

Figure 6:
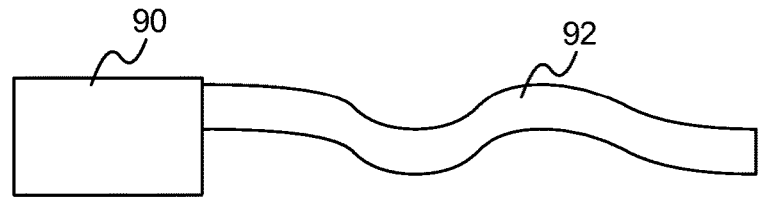
FIG. 6 illustrates a top down view of a printed circuit board with a flexible section configured as a hinge according to still yet another embodiment.

FIG. 6 illustrates a top down view of a printed circuit board with a flexible section configured as a hinge according to still yet another embodiment. A flexible section 92 of the printed circuit board is coupled to a rigid section 90. In the exemplary configuration shown in FIG. 6, the hinge has multiple direction changes, each of which forms a curve with an angle greater than 90 degree. Such a configuration forms a serpentine type hinge.

It is understood that a hinge can be configured having curves, corners, curves and corners, or other types of direction changes that are different than those shown in FIGS. 3-6.

In some embodiments, the hinge is pre-formed by pressing a flexible circuit into heated inter-locking dies and then cooling. It will relax much of the way, but still retain some bend. This may need to occur after PCBA solder reflow, so it doesn't interfere with SMT placement. In some embodiments, the flexible circuit is weaved through a plastic clip (with 2 or more openings) just before placement in a mold. The clip should ideally be fairly soft and have a melting point substantially above that of the molding material to remain permanent, or be made of the same material as the mold or with a melting point that is slightly higher, and merge with the molding material during the injection.

The hinge in the flexible section enables the flexible section to mechanically move without damaging, or minimize the propensity to damage, the interconnects within the flexible section. Damage can manifest as an open circuit or a higher resistance circuit due to mechanical stress. By creating one or more directional change points within the flexible section, one or more stress points of the flexible section are modified. The one or more directional change points determine where the flexible section bends and are able to disperse stress over a greater length. In this manner, the stress to the printed circuit board may be dispersed or moved to different areas so there is less chance that the interconnects will break and subsequently fail as the flexible section is twisted and bent. Additionally, the one or more directional change points decrease the chance that the flexible section will crimp or crease at the rigid to flexible transition area.

Figure 7:
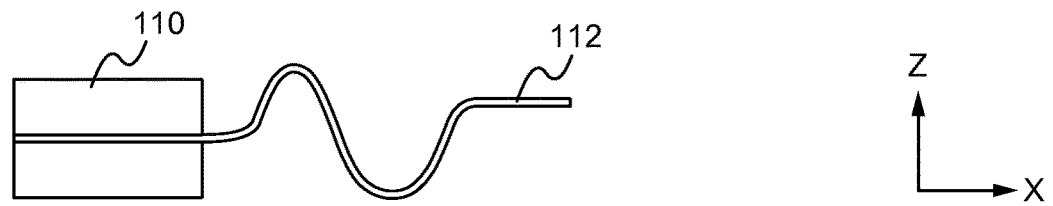
FIG. 7 illustrates a side view of a simplified printed circuit board stack having a rigid section and a flexible section.

In some embodiments, the directional change points are formed in the X-Y direction, where the X-direction corresponds to the length of the flexible circuit and the Y-direction corresponds to the width. In some embodiments, the directional change points are formed in the X-Z direction, where the Z-direction corresponds to a thickness of the flexible section. An example of directional change points configured in the X-Z direction is shown in FIG. 7. FIG. 7 illustrates a side view of a simplified printed circuit board stack having a rigid section 110 and a flexible section 112. An abbreviated number of layers in the printed circuit board stack are shown in FIG. 7. In some embodiments, the directional change points are formed in all three directions, X-Y-Z. Inclusion of directional change points in the Z-direction provides extra length to the flexible section thereby allowing certain degree of in-plane stretchability. This allows the bending, twisting, buckling or any type of combination of these dynamic motions to happen without over challenging the critical areas, such as the junction interface.

More specifically, directional change points in all three directions includes almost all in-plane and out-of-plane deformations and their combinations. For example, stretching and compression are in-plane deformation, while bending, twisting and buckling more often happen out-of-plane. Especially when over molded with soft stretchable materials, like soft thermoplastic polyurethane (TPU), the strechability of TPU allows the flexible section to deform according to the environment motion asserted, while the degree of the stretchable percentage of TPU, if designed correctly (less than the stretchable percentage of the flexible section), can protect the flexible section from being fully stretched and hence ruptured.

In some embodiments, the one or more directional change points are built into the electronics.

The mechanical hinge enables a higher degree of bending, flexing and twisting, stretching at the rigid to flexible transition area to maintain electrical continuity in the flexible section. The mechanical hinge also enables a degree of stretchability along the length of the flexible section. Examples of methods of fabricating the hinge include, but are not limited to, die-cutting, laser cutting, milling, water jet cutting, or photo-definable polyimide patterning. A support film may be applied before or after cutting to aid in handling. This support film may be permanent or temporary depending on the final use case of the product.

In some embodiments, the printed circuit board also includes one or more additional mechanical strengtheners, such as a film or woven glass material that is resistant to ripping or cracking. One or more mechanical strengthener layers can be added throughout the body of the printed circuit board. The one or more mechanical strengthener layers strengthen the flexible section so as to minimize or prevent ripping or cracking as the printed circuit board is bent, flexed and twisted. The one or more mechanical strengthener layers can be attached at one or more specific locations through the stack in order to strengthen the printed circuit board. The mechanical strengtheners are used in addition the hinge portion of the flexible section.

Figure 8:
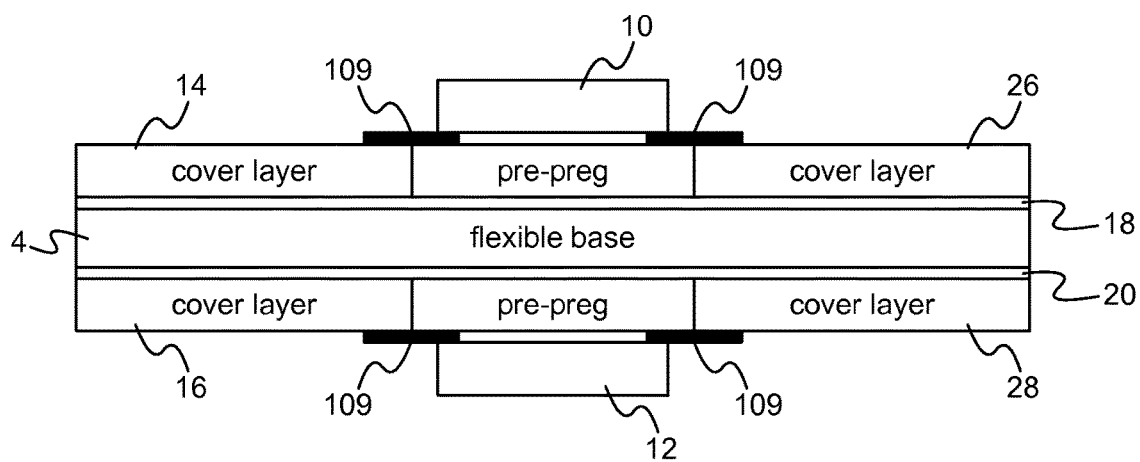
FIG. 8 illustrates a side view of a printed circuit board stack with mechanical strengtheners according to an embodiment.

FIG. 8 illustrates a side view of a printed circuit board stack with mechanical strengtheners according to an embodiment. The printed circuit board of FIG. 8 is similar to the printed circuit board of FIG. 1 with the addition of one or more mechanical strengtheners 109. The mechanical strengtheners 109 can be added onto the outermost cover layer, as shown in FIG. 8, and/or added throughout the body of the printed circuit board. The mechanical strengtheners 109 strengthen the printed circuit board so it is not ripped or cracked as the circuit is bent, flexed and twisted. The mechanical strengtheners 109 are attached at one or more specific locations in order to strengthen the printed circuit board. The mechanical strengtheners 109 can be added on the inner layers and/or outer layers of the printed circuit board depending upon the desired application.

The present application has been described in terms of specific embodiments incorporating details to facilitate the understanding of the principles of construction and operation of the printed circuit board hinge. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A circuit board comprising:
   a. one or more rigid sections, wherein each rigid section comprises multiple layers stacked along a Z-direction;
   b. one or more flexible sections coupled to the one or more rigid sections; and
   c. one or more radius sections having a pre-formed, steady-state non-linear shape within portions of the one or more flexible sections that extend from the one or more rigid sections such that when the one or more flexible sections are in a steady state condition the one or more radius sections maintain the pre-formed, steady state non-linear shape, and when the one or more flexible sections are subject to movement relative to the one or more rigid sections the one or more radius sections are deformed from the steady state non-linear shape such that stress resulting from the relative movement is distributed across a length of the one or more radius sections, wherein the one or more radius sections have the preformed, steady-state non-linear shape along an X-Y plane perpendicular to the Z-direction and through an entire thickness of the one or more flexible sections, and a pre-formed, steady-state linear shape along the Z-direction further wherein the one or more radius sections are unsupported, further comprising a mechanical strengthener layer positioned at one or more transition locations between each of the one or more rigid sections and a corresponding adjacent one of the one or more flexible sections, wherein a first portion of the mechanical strengthener layer extends partially into the rigid section and a second portion of the mechanical strengthener layer extends partially into the corresponding adjacent flexible section.

2. The circuit board of claim 1 wherein the one or more flexible sections comprise a flexible circuit board.

3. The circuit board of claim 1 wherein the one or more flexible sections comprise a stretchable circuit board.

4. The circuit board of claim 1 wherein each of the one or more radius sections comprise a radius greater than zero.

5. The circuit board of claim 1 wherein the one or more radius sections comprise a length of greater than zero to ten inches.

6. The circuit board of claim 1 wherein a stress applied to the bending, flexing or twisting of the one or more flexible sections is distributed across the one or more radius sections.

7. The circuit board of claim 1 wherein the one or more radius sections form a directional change in the portion of the one or more flexible sections in the X-Y plane that corresponds to a length and width of the one or more flexible sections.

8. The circuit board of claim 1 wherein the one or more radius sections reduce crimping or creasing at a rigid to flexible transition area.

9. A circuit board comprising:
   a. a rigid section comprising multiple layers stacked along a Z-direction; and
   b. a flexible section coupled to the rigid section, wherein the flexible section comprises a hinge having a pre-formed, steady-state non-linear shape with a plurality of directional change points, wherein the plurality of directional change points comprise a plurality of directional changes relative to a length of the flexible section and a plurality of directional changes relative to a transverse direction from the length of the flexible section, further wherein the hinge maintains the pre-formed, steady state non-linear shape when the flexible section is in a steady state condition, and the hinge is deformed from the steady state nonlinear shape when the flexible section is subject to movement relative to the rigid section such that stress resulting from the relative movement is distributed across the a-length of the hinge, wherein the hinge has the pre-formed, steady-state nonlinear shape along an X-Y plane perpendicular to the Z-direction and through an entire thickness of the flexible section, and a pre-formed, steady-state linear shape along the Z-direction further wherein the flexible section is unsupported along the hinge, further comprising a mechanical strengthener layer positioned at one or more transition locations between the rigid section and the flexible section, wherein a first portion of the mechanical strengthener layer extends partially into the rigid section and a second portion of the mechanical strengthener layer extends partially into the flexible section.

10. The circuit board of claim 9 wherein when the flexible section is moved relative to the rigid section a stress is applied, and the stress is distributed across the hinge.

11. The circuit board of claim 10 wherein the stress is distributed to each of the plurality of directional change points of the hinge.

12. The circuit board of claim 9 wherein the flexible section comprises a flexible circuit board.

13. The circuit board of claim 9 wherein the flexible section comprises a stretchable circuit board.

14. The circuit board of claim 9 wherein each of the plurality of directional change points comprise a corner.

15. The circuit board of claim 9 wherein each of the plurality of directional change points comprise a curve.

16. The circuit board of claim 9 wherein each of the plurality of directional change points comprise either a corner or a curve.

17. The circuit board of claim 9 wherein the non-linear shape comprises a sawtooth pattern.

18. The circuit board of claim 9 wherein the non-linear shape comprises a S-shaped pattern.

19. The circuit board of claim 9 wherein the non-linear shape comprises a serpentine pattern.

20. The circuit board of claim 9 wherein the hinge has a length of greater than zero to ten inches.

21. The circuit board of claim 9 wherein each of the plurality of directional point changes form a directional change in the flexible section in the X-Y plane that corresponds to a length and a width of the flexible section.

22. The circuit board of claim 9 wherein the hinge reduces crimping or creasing at a rigid to flexible transition area.

* * * * *